(12) United States Patent
Soeno et al.

(10) Patent No.: US 9,768,287 B1
(45) Date of Patent: Sep. 19, 2017

(54) SWITCHING DEVICE

(71) Applicant: TOYOTA JIDOSHA KABUSHIKI KAISHA, Toyota-shi, Aichi-ken (JP)

(72) Inventors: Akitaka Soeno, Toyota (JP); Takashi Kuno, Kariya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/425,714

(22) Filed: Feb. 6, 2017

(30) Foreign Application Priority Data

Mar. 9, 2016 (JP) ................. 2016-046134

(51) Int. Cl.
| H01L 29/73 | (2006.01) |
| H01L 29/739 | (2006.01) |
| H01L 29/10 | (2006.01) |
| H01L 29/06 | (2006.01) |
| H01L 23/528 | (2006.01) |

(52) U.S. Cl.
CPC ...... H01L 29/7397 (2013.01); H01L 23/5283 (2013.01); H01L 29/0623 (2013.01); H01L 29/0696 (2013.01); H01L 29/1095 (2013.01)

(58) Field of Classification Search
CPC ... H01L 29/06; H01L 29/062; H01L 29/0623; H01L 29/069; H01L 29/0696; H01L 29/10; H01L 29/109; H01L 29/1095; H01L 29/73; H01L 29/739; H01L 29/7397; H01L 23/52; H01L 23/528; H01L 23/5283

USPC ......................................................... 257/139
See application file for complete search history.

(56) References Cited

U.S. PATENT DOCUMENTS

| 2005/0077617 A1 | 4/2005 | Hirano et al. |
| 2011/0220991 A1 | 9/2011 | Takaya |
| 2017/0025521 A1 | 1/2017 | Nakagawa et al. |

FOREIGN PATENT DOCUMENTS

| JP | 2005-116963 A | 4/2005 |
| JP | 2011-187708 A | 9/2011 |
| JP | 2014-038963 A | 2/2014 |
| JP | 2017-028069 A | 2/2017 |

Primary Examiner — Monica D Harrison
(74) Attorney, Agent, or Firm — Oliff PLC

(57) ABSTRACT

A switching device includes a semiconductor substrate having a first element range including first trenches for gates, and an ineffective range not including the first trenches. In an interlayer insulating film, a contact hole is provided within the first element range, and a wide contact hole is provided within the inactive range. The first metal layer contacts the semiconductor substrate within the contact hole and the wide contact hole. The insulating protective film covers an outer peripheral side portion of a bottom surface of a second recess which is provided in a surface of the first metal layer above the wide contact hole. A side surface of an opening provided in a portion of the insulating protective film that includes the first element range is disposed in the second recess. The second metal layer contacts the first metal layer and the side surface of the opening.

5 Claims, 9 Drawing Sheets

SWITCHING DEVICE

TECHNICAL FIELD

The present disclosure relates to a switching device.

BACKGROUND ART

Japanese Patent Application Publication No. 2005-116963 discloses a switching device having a semiconductor substrate, an upper surface of which is connected to a heat sink block by soldering.

Further Japanese Patent Application Publication No. 2011-187708 discloses a switching device having a plurality of trenches that extend linearly in an upper surface of a semiconductor substrate. Each of the trenches extends parallel to one another along a certain direction. Inner surfaces of the trenches are covered with gate insulating films. Gate electrodes are disposed inside of the trenches. An interlayer insulating film covers an upper surface of the semiconductor substrate and the gate electrodes. A contact hole is provided in the interlayer insulating film above each semiconductor region (hereinafter referred to as an inter-trench region) interposed between each pair of adjacent trenches in the semiconductor substrate. An upper electrode covers the interlayer insulating film, and is in contact with the semiconductor substrate in the contact holes. Each of the inter-trench regions includes a first region (emitter region) of a first conductivity type (n-type), and a body region of a second conductivity type (p-type). Each of the first regions is in contact with the upper electrode and the corresponding gate insulating film. The body region is in contact with the upper electrode, and is in contact with the gate insulating films below the first regions. Further, the semiconductor substrate includes a second region (drift region) of the first conductivity type. The second region is in contact with the gate insulating films below the body region, and is separated from the first regions by the body region. In this switching device, when a potential of the gate electrodes is controlled to a predetermined potential, channels are formed in the body region. The first regions and the second region are electrically connected by the channels. Accordingly, a current flows between the first regions and the second region.

SUMMARY

An upper electrode of such a switching device as disclosed in Japanese Patent Application Publication No. 2005-116963 usually includes a first metal layer and a second metal layer. The first metal layer is a metal layer being in contact with the upper surface of the semiconductor substrate. The first metal layer is constituted of a material that is less likely to contaminate the semiconductor substrate and makes contact with the semiconductor substrate at a low contact resistance. The second metal layer is a metal layer disposed on the first metal layer and makes contact with soldering. The second metal layer is constituted of a material that is easy to be connected to the soldering.

In a switching device that includes trenches as disclosed in Japanese Patent Application Publication No. 2011-187708, an upper electrode may be sometimes constituted of a first metal layer and a second metal layer to connect the upper electrode to an exterior by soldering. For example, FIG. 9 shows a cross section of a switching device having trenches 140. In FIG. 9, an upper electrode 150 is constituted of a first metal layer 151 and a second metal layer 152. When the first metal layer 151 is formed, recesses 151a are formed on a surface of the first metal layer 151 above contact holes 162a of an interlayer insulating film 162. Accordingly, the first metal layer 151 has a plurality of the recesses 151a on its upper surface. The second metal layer 152 is disposed on the first metal layer 151. Accordingly, the second metal layer 152 is filled in each recess 151a. Further, in a switching device as described in Japanese Patent Application Publication No. 2011-187708, as shown in FIG. 9, an upper surface in an outer peripheral portion of a semiconductor substrate 118 is usually covered with an insulating protective film 160. The insulating protective film 160 is provided to cover an outer peripheral side portion of the first metal layer 151 such that no gap is generated between the first metal layer 151 and the insulating protective film 160. The insulating protective film 160 has an opening 180. The second metal layer 152 covers the first metal layer 151 in the opening 180. Further, the second metal layer 152 is provided to make contact with an inner peripheral side end 160a (a side surface of the opening 180) of the insulating protective film 160 such that no gap is generated between the second metal layer 152 and the insulating protective film 160. Notably, in FIG. 9, a portion of the second metal layer 152 is disposed above the insulating protective film 160. However, the second metal layer 152 may not be disposed above the insulating protective film 160.

As the switching device in FIG. 9 operates, a temperature of the semiconductor substrate 118 rises. Then, temperatures of the first metal layer 151, the second metal layer 152 and the insulating protective film 160 also rise. A linear expansion coefficient of the second metal layer 152 is generally smaller than a linear expansion coefficient of the first metal layer 151. Further, a linear expansion coefficient of the insulating protective film 160 is generally equal to or larger than the linear expansion coefficient of the first metal layer 151. The first metal layer 151 thermally expands along with the second metal layer 152 in a range where the first metal layer 151 is in contact with the second metal layer 152. Since the linear expansion coefficient of the second metal layer 152 is small, thermal expansion of the first metal layer 151 is suppressed in the range. Especially since the second metal layer 152 is filled in each recess 151a in the upper surface of the first metal layer 151, the first metal layer 151 is firmly restrained by the second metal layer 152. Due to this, thermal expansion amount of the first metal layer 151 is small in the range where the first metal layer 151 is in contact with the second metal layer 152. On the other hand, the first metal layer 151 thermally expands along with the insulating protective film 160 in a range where the first metal layer 151 is in contact with the insulating protective film 160. Since the linear expansion coefficient of the insulating protective film 160 is relatively large, the thermal expansion amount of the first metal layer 151 is relatively large in this range. The first metal layer 151 directly below the inner peripheral side end 160a of the insulating protective film 160 is positioned at a boundary between a range having a small thermal expansion amount (the range where the first metal layer 151 is in contact with the second metal layer 152) and a range having a large thermal expansion amount (the range where the first metal layer 151 is in contact with the insulating protective film 160). Due to this, when the temperature of the switching device changes, stress is likely to concentrate on the first metal layer 151 directly below the end 160a, and cracks are thus liable to occur in the first metal layer 151 in this portion.

Contrary to this, as shown in FIG. 10, it is conceivable that an entirety of an upper surface of each inter-trench region 142 (region surrounded by two trenches 140) is covered with the interlayer insulating film 162 in a vicinity of the inner peripheral side end 160a of the insulating protective film 160 (that is, the contact holes 162a are not provided in the interlayer insulating film 162 in the vicinity of the end 160a). An upper surface of the interlayer insulating film 162 becomes flat in a range where the contact holes 162a are not provided. Due to this, the upper surface of the first metal layer 151 also becomes flat on the interlayer insulating film 162 in this range. That is, the recesses 151a are not present in the upper surface of the first metal layer 151 in this range. Accordingly, in this range, the first metal layer 151 is in contact with the second metal layer 152 at a flat surface. The restraining force of the second metal layer 152 upon the first metal layer 151 is weak at the flat surface. Due to this, the thermal expansion amount of the first metal layer 151 in the flat surface range is large compared to the thermal expansion amount of the first metal layer 151 in a range where the recesses 151a are present (notably, the thermal expansion amount of the first metal layer 151 even in this flat surface range is small compared to the thermal expansion amount of the first metal layer 151 in a range where the first metal layer 151 is in contact with the insulating protective film 160). As a result of this, a difference in thermal expansion amount of the first metal layer 151 between a range where the thermal expansion amount of the first metal layer 151 is small (range where the first metal layer 151 is in contact with the second metal layer 152) and a range where the thermal expansion amount of the first metal layer 151 is large (range where the first metal layer 151 is in contact with the insulating protective film 160) becomes small at a position directly below the end 160a of the insulating protective film 160. Due to this, this configuration reduces stress generated in the first metal layer 151 at the position directly below the end 160a, and suppresses the occurrence of the cracks in the first metal layer 151 at this portion.

However, according to the configuration of FIG. 10, there occurs a problem that a resistance of the second region 126 increases upon when the switching device turns on. The details will be explained hereinbelow. In FIG. 10, in each inter-trench region 142 below the interlayer insulating film 162 in a range where no contact holes 162a are present, the body region 124 is not connected to the upper electrode 150. Upon when the switching device turns off, a difference in potential between the second region 126 and the body region 124 becomes large. Then, a depletion layer extends from a pn junction at an interface between the second region 126 and the body region 124. This depletion layer depletes the second region 126 in a wide range. Further, this depletion layer partially depletes the body region 124 as well. When the depletion layer expands in the body region 124, a part of charges in the body region 124 (e.g., holes) is reunited with charges in the second region 126 (e.g., electrons) to disappear. Accordingly, as the depletion layer expands, the charges in the body region 124 reduce.

After that, when the potential of the gate electrodes 130 is controlled to a gate-on potential, channels are formed in the body region 124 in a range adjacent to gate insulating films 132. Then the potential of the second region 126 becomes substantially equal to a potential of first regions 122. Charges are then supplied from the upper electrode 150 to the body region 124 shortly in a range where the body region 124 is connected to the upper electrode 150. Due to this, the depletion layer extending from the pn junction at the interface between the body region 124 and the second region 126 shortly disappears. Accordingly, a current flows between a lower electrode 154 and the upper electrode 150.

Contrary to this, charges are hardly supplied from the upper electrode 150 to the body region 124 in a range where the contact holes 162a are not present. For example, if the body region 124 in the range where the contact holes 162a are not present is electrically separated from the upper electrode 150, charges are hardly supplied from the upper electrode 150 to the body region 124 in this range. Further, even if the body region 124 in the range where the contact holes 162a are not present is electrically connected to the upper electrode 150 at a portion not shown, it would take time to supply charges to the body region 124 in that portion since a distance between the connection point and the body region 124 in the range where no contact holes 162a are present is long. As such, since charges are hardly supplied to the body region 124 in the range where no contact holes 162a are present, a state where the depletion layer extends below the body region 124 in this range is maintained for a while even when the channels have been formed. That is, even in an ON-state, as shown in FIG. 10, a depletion layer 159 has spread from the body region 124 in the range where the contact holes 162a are not present into the second region 126 for a while. Due to this, in this switching device, a current path in the second region 126 is narrow and a resistance of the second region 126 is high just after the turning-ON. As such, the resistance of the second region 126 is high just after the turning-ON.

Notably, in FIGS. 9 and 10, the switching device including a collector region 128 (i.e., IGBT: Insulated Gate Bipolar Transistor) is exemplified. However, a similar problem may occur in a case of a FET (Field Effect Transistor), which does not include the collector region 128. The above-described problem may occur both in an n-channel type FET and a p-channel type FET. Further, in FIGS. 9 and 10, the electrode 154 is provided on a lower surface of the semiconductor substrate 118. However the electrode 154 may be provided in another position.

The present disclosure provides a technique that can suppress occurrence of cracks in a first metal layer directly below a side surface of an opening of an insulting protective film, and can reduce resistance of a second region when the switching device being turned on.

A switching device disclosed herein comprises: a semiconductor substrate; a gate insulating film; a gate electrode; an interlayer insulating film; a first metal layer; a second metal layer, and an insulating protective film. In the switching device, the semiconductor substrate comprises a first element range, and an ineffective range. A plurality of first trenches is provided in an upper surface of the semiconductor substrate within the first element range and is not provided within the ineffective range. The first trenches extend along a first direction and are arranged with intervals along a second direction perpendicular to the first direction. The ineffective range is provided adjacent to the first element range in the second direction. The gate insulating film covers inner surfaces of the first trenches. The gate electrodes are disposed inside of the first trenches, and each gate electrode is insulated from the semiconductor substrate by the corresponding gate insulating film. The interlayer insulating film covers the upper surface and the gate electrode. Within the first element range a contact hole is provided in a portion of the interlayer insulating film that covers the upper surface. Within the ineffective range a wide contact hole is provided in the interlayer insulating film in a portion that coves the upper surface, and the wide contact hole has a width in the second direction wider than a pitch between each pair of adjacent first trenches in the second direction. The first metal layer covers the interlayer insulating film, is insulated from the gate electrode by the interlayer insulating film, and is in contact with the semiconductor substrate within the contact hole and the wide contact hole. A first recess is provided in a surface of the first metal layer above the contact hole, and a second recess is provided in a front surface of the first metal layer above the wide contact hole. The insulating protective film covers an outer peripheral side part of a bottom surface of the second recess. An opening is provided in the insulating protective film in a range wider than the first element range and including the first element range. A side surface of the opening is disposed in the second recess. The second metal layer is in contact with the surface of the first metal layer in the opening and is in contact with the side surface of the opening, and the second metal layer has a linear expansion coefficient smaller than a linear expansion coefficient of the first metal layer. Each semiconductor region interposed between each pair of adjacent first trenches in the first element range comprises: a first region of a first conductivity type, being in contact with the first metal layer in the contact hole and in contact with the gate insulating film, and a body region of a second conductivity type, being in contact with the first metal layer and being in contact with the corresponding gate insulating film below the first region. The semiconductor region within the ineffective range comprises a second conductivity type peripheral region of the second conductivity type, and the second conductivity type peripheral region is in contact with the first metal layer in the wide contact hole, and extends from the upper surface to a position deeper than lower ends of the first trenches. The semiconductor substrate comprises a second region of the first conductivity type, and the second region is disposed and extends across below the body region and below the second conductivity type peripheral region, is in contact with the gate insulating film below the body region, and is separated from the first region by the body region.

In this switching device, the first trenches are not provided in the upper surface of the semiconductor substrate in the ineffective range. Further, the wide contact hole is provided in the interlayer insulating film in the ineffective range. Within the wide contact hole, the first metal layer is in contact with the second conductivity type peripheral region. When tuning off the switching device, depletion layer extends from a pn junction at an interface between the second conductivity type peripheral region and the second region. At this occasion, charges in the second conductivity type peripheral region decrease. Upon when turning on the switching device, charges are supplied to the second conductivity type peripheral region from the first metal layer within the wide contact hole. Due to this, when the switching device turns on, the depletion layer that had extended from the pn junction at the interface between the second conductivity type peripheral region and the second region shortly disappears. Accordingly, current can flow through the second region in a wide range. Due to this, in this switching device, the resistance of the second region is decreased shortly after tuning on. This switching device is able to operate at a low loss.

Further, since the first metal layer extends over to the inside of the wide contact hole, the second recess is formed in the surface of the first metal layer above the wide contact hole. Since the width of the wide contact hole is great, the width of the second recess is also great. Thus, the bottom surface of the second recess is flat in a wide range. In this switching device, the side surface of the opening of the insulating protective film (an inner peripheral side end of the insulating protective film) is positioned within the second recess (i.e., range where the first metal layer has a flat surface). Due to this, similarly to the case of FIG. 10, stress applied to the first metal layer at the position directly below the side surface of the opening of the insulting protective film is mitigated. Thus, in this switching device, cracks are less likely to occur at the position directly below the side surface of the opening of the insulating protective film.

Further, if the ineffective range where the first trenches are not present is provided, the electric field may concentrate around a portion below the first trench disposed closest to the ineffective range when the switching device is in OFF-state. However, in this switching device, the second conductivity type peripheral region extends to a position deeper than the lower ends of the first trenches. According to this configuration, when the switching device is in the OFF-state, the lower end of the first trench disposed closest to the ineffective range is protected by the depletion layer extending from the second conductivity type peripheral region. Due to this, the electric field concentration can be suppressed around the portion of the lower end of the first trench. According to this switching device, even if the ineffective range where the first trenches are not present is provided, sufficient breakdown voltage can be secured.

As described above, according to the switching device disclosed herein, occurrence of cracks in the first metal layer directly below the side surface of the opening of the insulating protective film can be suppressed. In addition, according to this switching device, the resistance of the second region can be shortly decreased upon when tuning on the switching device. Further, according to this switching device, even if the ineffective range where the first trenches are not present is provided, the electric field concentration can be suppressed.

DETAILED DESCRIPTION

Embodiment 1

Figure 1:
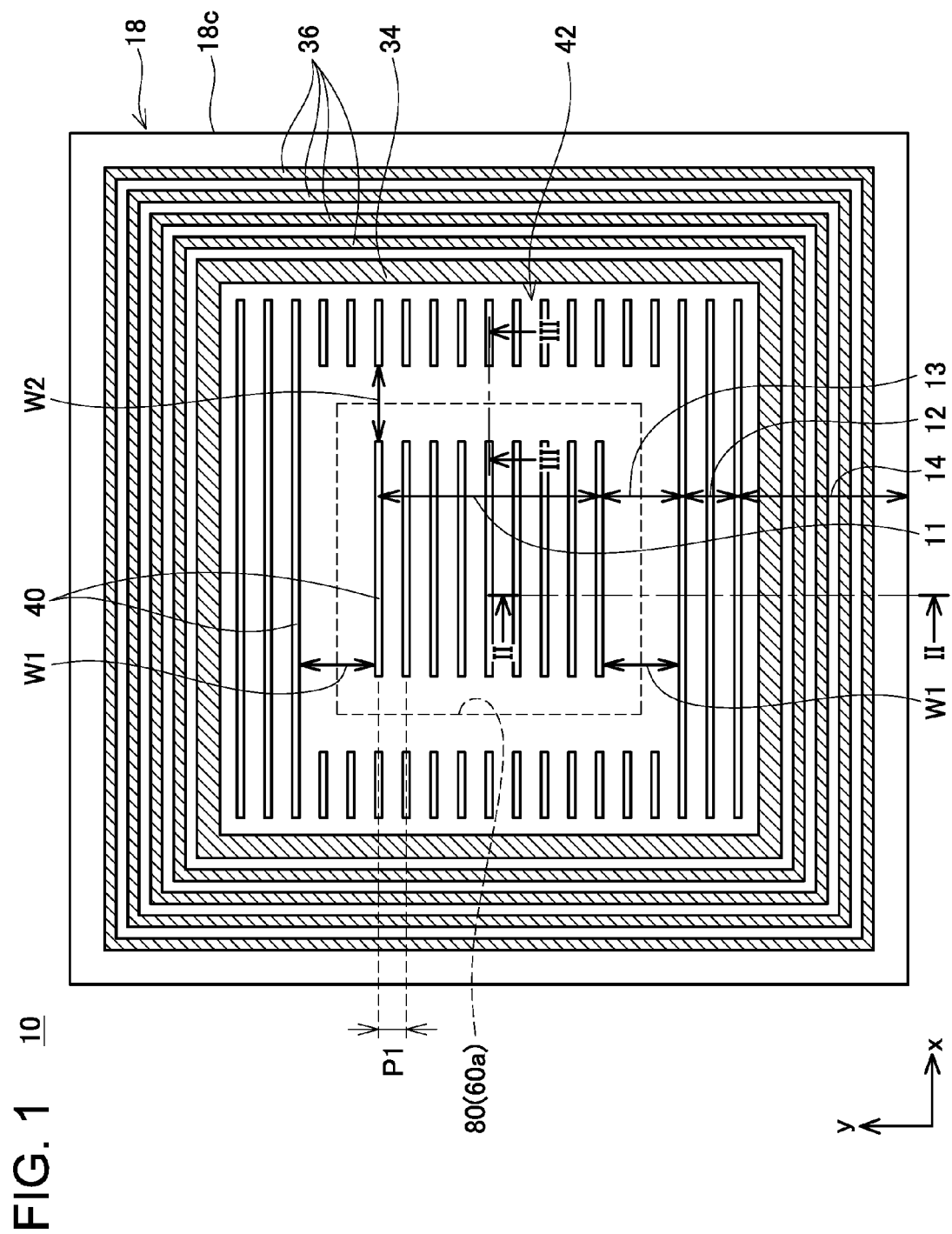
FIG. 1 is a plan view of an IGBT of embodiment 1.
Figure 2:
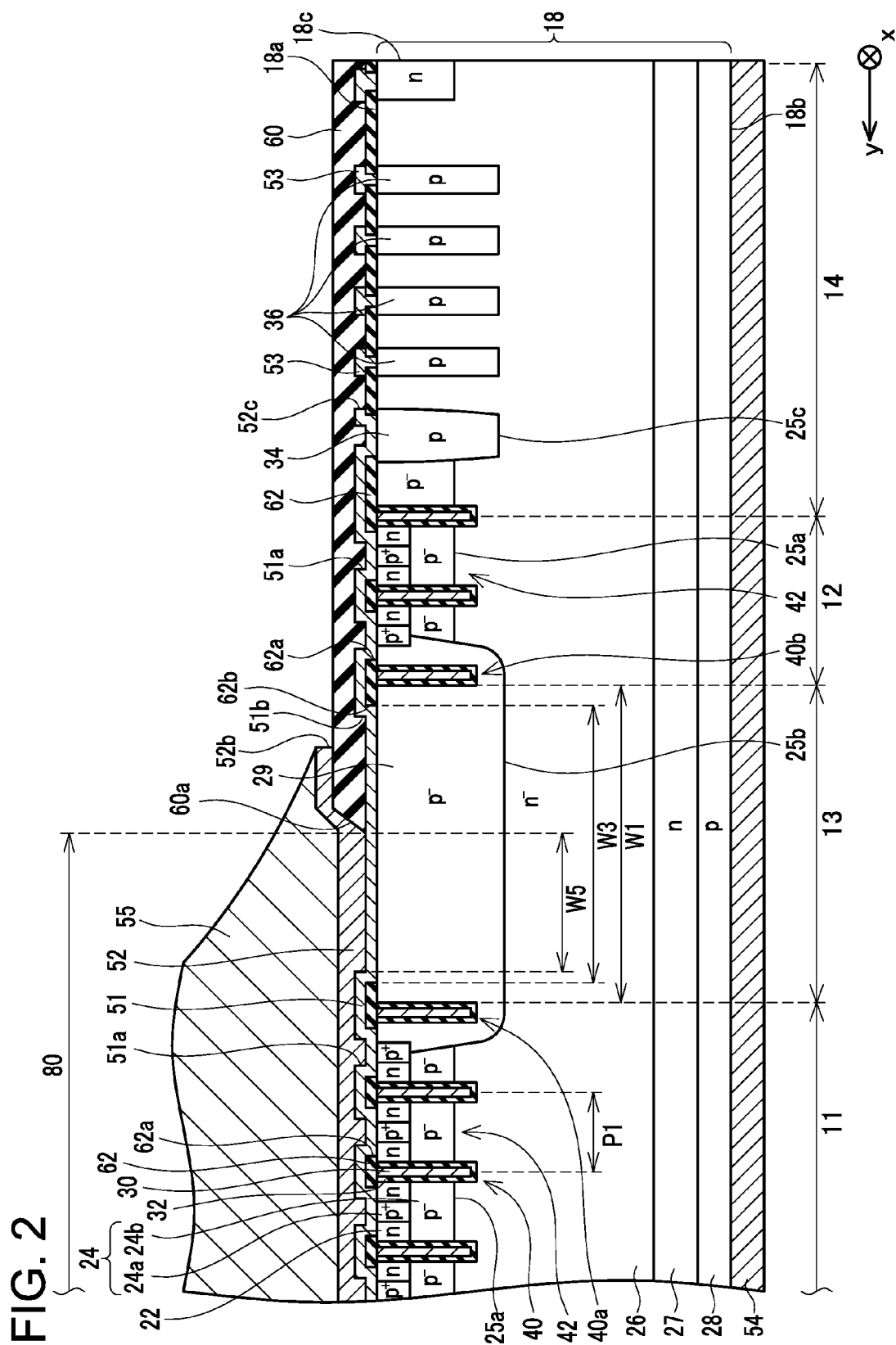
FIG. 2 is a vertical cross sectional view taken along line of II-II of FIG. 1.
Figure 3:
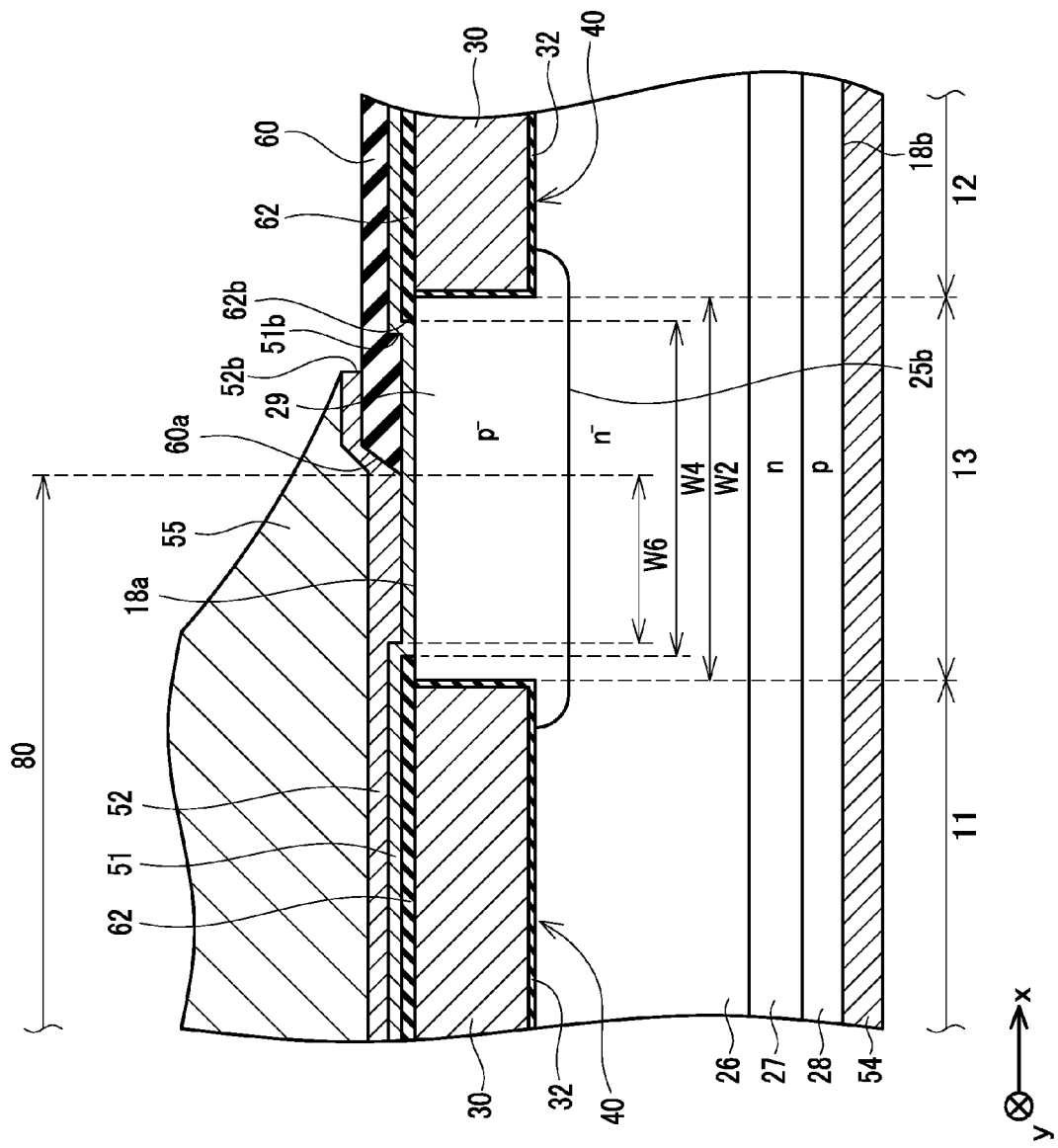
FIG. 3 is a vertical cross sectional view taken along line of III-III of FIG. 1.

An IGBT 10 of embodiment 1 shown in FIGS. 1 to 3 comprises a semiconductor substrate 18, electrodes each provided on an upper surface 18a and a lower surface 18b of the semiconductor substrate 18, and insulating films. Notably, in FIG. 1, illustration of the electrode on the upper surface 18a of the semiconductor substrate 18 and the insulating films is omitted for easier explanation. Further, in FIG. 1, for easier view, a terminal region 34 and guard rings 36 are indicated by hatching. Further, a direction parallel to the upper surface 18a of the semiconductor substrate 18 will be denoted as an x direction and a direction parallel to the upper surface 18a and perpendicular to the x direction will be denoted as a y direction, hereinbelow.

As shown in FIG. 1, a plurality of trenches 40 is provided in the upper surface 18a of the semiconductor substrate 18. The trenches 40 extend along the x direction parallel to each other, and arranged at intervals along the y direction. Each region between each pair of the adjacent trenches 40 will be hereinafter referred to as an inter-trench region 42. The semiconductor substrate 18 comprises a first element range 11, a second element range 12 and a surrounding range 13. The trenches 40 are provided in the first element range 11, and the second element range 12. Within the surrounding range 13, no trenches 40 are present. Within the surrounding range 13, any of the trenches are not provided, and the upper surface 18a of the semiconductor substrate 18 is flat within the surrounding range 13.

The first element range 11 is provided in a substantially center of the semiconductor substrate 18. The trenches 40 are repeatedly provided at a constant pitch P1 in the first element range 11 along the y direction.

The surrounding range 13 is provided on an outer peripheral side of the first element range 11 (i.e., a range between the first element range 11 and an outer peripheral end surface 18c of the semiconductor substrate 18). The surrounding range 13 surrounds a periphery of the first element range 11. As described above, in the surrounding range 13, no trenches 40 are provided. A width W1 in the y direction of the surrounding range 13 in a portion adjacent to the first element range 11 in the y direction (i.e., an interval between the first element range 11 and the second element range 12 in the y direction) is greater than twice the above-described pitch P1. Further, a width W2 in the x direction of the surrounding range 13 in the portion adjacent to the first element range 11 in the x direction is greater than twice the pitch P1.

The second element range 12 is provided on an outer peripheral side of the surrounding range 13 (i.e., range between the surrounding range 13 and the outer peripheral end surface 18c of the semiconductor substrate 18). Within the second element range 12, the trenches 40 are repeatedly provided at the constant pitch P1 along the y direction. The surrounding range 13 (i.e., range where no trenches are provided) is disposed between the first element range 11 and the second element range 12. The second element range 12 is separated from the first element range 11 by the surrounding range 13. The second element range 12 surrounds a periphery of the surrounding range 13. Within the second element range 12 trenches 40 are repeatedly provided along the y direction at a pitch equal to the above-described pitch P1 (the pitch P1 of the trenches 40 in the first element range 11).

An outer peripheral voltage resistant range 14 is provided on an outer peripheral side of the second element range 12 (i.e., between the second element range 12 and the outer peripheral end surface 18c of the semiconductor substrate 18). No trenches 40 are present in the outer peripheral voltage resistant range 14. The outer peripheral voltage resistant range 14 surrounds the second element range 12.

As shown in FIGS. 2 and 3, inner surfaces of the trenches 40 are covered with gate insulating films 32. Further, a gate electrode 30 is disposed inside each trench 40. Each gate electrode 30 is insulated from the semiconductor substrate 18 by the corresponding gate insulating film 32.

As shown in FIGS. 2, 3, each inter-trench region 42 in the first element range 11 includes emitter regions 22 and a body region 24.

Each emitter region 22 is an n-type region. The emitter region 22 is disposed in a range exposed in the upper surface 18a of the semiconductor substrate 18. The emitter region 22 is in contact with the corresponding gate insulating film 32 at an uppermost portion of the corresponding trench 40.

The body region 24 is a p-type region. The body region 24 is exposed on the upper surface 18a of the semiconductor substrate 18 in a range where no emitter regions 22 are present. The body region 24 extends from the position exposed on the upper surface 18a to a position below the emitter regions 22. The body region 24 includes high density regions 24a and a low density region 24b that has a lower p-type impurity density than the high density regions 24a. Each high density region 24a is disposed in a range exposed on the upper surface 18a. The low density region 24b is disposed lower than the emitter regions 22. The low density region 24b is in contact with the gate insulating films 32 below the emitter regions 22.

Each inter-trench region 42 in the second element range 12 also includes the emitter regions 22 and the body region 24. The emitter regions 22 and the body region 24 in the second element range 12 have the same configurations as those of the emitter regions 22 and the body region 24 in the first element range 11 respectively.

As shown in FIGS. 2 and 3, a p-type peripheral region 29 is provided within the surrounding range 13. The p-type peripheral region 29 is provided in the surrounding range 13 in a range exposed on the upper surface 18a of the semiconductor substrate 18. The p-type peripheral region 29 is a p-type region having a p-type impurity density higher than the p-type impurity density of the low density regions 24b of the body regions 24. The p-type peripheral region 29 extends from the upper surface 18a of the semiconductor substrate 18 to a depth lower than lower ends of the trenches 40. The p-type peripheral region 29 extends along the surrounding range 13 so as to surround the periphery of the first element range 11. As shown in FIG. 2, the p-type peripheral region 29 covers a trench 40 (hereinafter referred to as a trench 40a) which is positioned in the first element range 11 and closest to the surrounding range 13e in the y direction. More specifically, the p-type peripheral region 29 is in contact with both side surfaces and a bottom surface of the trench 40a. Further as shown in FIG. 2, the p-type peripheral region 29 covers a trench 40 (hereinafter referred to as a trench 40b) which is positioned in the second element range 12 and closest to the surrounding range 13 element range in the y direction. More specifically, the p-type peripheral region 29 is in contact with both side surfaces and a bottom surface of the trench 40b. Further, as shown in FIG. 3, the p-type peripheral region 29 covers an end in the x direction of each trench 40 in the first element range 11. More specifically, the p-type peripheral region 29 is in contact with the side surfaces and the bottom surface of each trench 40 at the ends in the x direction within the first element range 11. Further, as shown in FIG. 3, the p-type peripheral region 29 covers the ends of each trench 40 in the x direction within the second element range 12. More specifically, the p-type peripheral region 29 is in contact with the side surfaces and the bottom surface of each trench 40 at the ends of each trench 40 in the x direction within the second element range 12.

As shown in FIGS. 1 and 2, a terminal region 34 and a plurality of guard rings 36 are provided in the outer peripheral voltage resistant range 14.

The terminal region 34 is a p-type region, and is positioned in a range exposed on the upper surface 18a of the semiconductor substrate 18. The terminal region 34 extends from the upper surface 18a to a lower side than the lower ends of the trenches 40. The terminal region 34 extends in an annular shape to surround the first element range 11, the surrounding range 13, and the second element range 12.

Each guard ring 36 is a p-type region, and is positioned in a range exposed on the upper surface 18a of the semiconductor substrate 18. Each guard ring 36 extends from the upper surface 18a to a depth lower than the lower end of each trench 40. The terminal region 34 is surrounded by the multiple guard rings 36. That is, each guard ring 36 extends in an annular shape to surround the first element range 11, the surrounding range 13, and the second element range 12. Each guard ring 36 is separated from the body regions 24 and the terminal region 34. Further, the respective guard rings 36 are separated from each other.

As shown in FIGS. 2, 3, the semiconductor substrate 18 includes a drift region 26, a buffer region 27, and a collector region 28.

The drift region 26 is an n-type region having a low n-type impurity density. The drift region 26 extends across the first element range 11, the surrounding range 13, the second element range 12, and the outer peripheral voltage resistant range 14. Within the first element range 11, the drift region 26 is disposed below the body region 24 and is in contact with the body region 24 from below the body region 24. Within the first element range 11, the drift region 26 is separated from the emitter regions 22 by the body region 24. Within the first element range 11, the drift region 26 is in contact with the gate insulating films 32 at below the body region 24. Within the surrounding range 13, the drift region 26 is disposed below the p-type peripheral region 29 and is in contact with the p-type peripheral region 29 from below the p-type peripheral region 29. Within the second element range 12 the drift region 26 is disposed below the body region 24, and is in contact with the body region 24 from below the body region 24. Within the second element range 12, the drift region 26 is separated from the emitter regions 22 by the body region 24. Within the second element range 12, the drift region 26 is in contact with the gate insulating films 32 at below the body region 24. The drift region 26 is in contact with the terminal region 34 and the respective guard rings 36 within the outer peripheral voltage resistant range 14. The terminal region 34 is separated from the guard rings 36 by the drift region 26. Further, the respective guard rings 36 are separated from each other by the drift region 26.

The buffer region 27 is an n-type region having a higher n-type impurity density than the drift region 26. The buffer region 27 extends across the first element range 11, the surrounding range 13, the second element range 12, and the outer peripheral voltage resistant range 14. The buffer region 27 is disposed below the drift region 26, and is in contact with the drift region 26 from blow the drift region 26.

The collector region 28 is a p-type region. The collector region 28 extends across the first element range 11, the surrounding range 13, the second element range 12, and the outer peripheral voltage resistant range 14. The collector region 28 is disposed below the buffer region 27, and is in contact with the buffer region 27 from below the buffer region 27. The collector region 28 is exposed on the lower surface 18b of the semiconductor substrate 18.

As shown in FIGS. 2 and 3, an interlayer insulating film 62, an ohmic metal layer 51, a plurality of ring electrodes 53, an insulating protective film 60, and a surface metal layer 52 are arranged above the semiconductor substrate 18.

The interlayer insulating film 62 is disposed on the upper surface 18a of the semiconductor substrate 18. Entireties of upper surfaces of the gate electrodes 30 are covered with the interlayer insulating film 62. A contact holes 62a piercing the interlayer insulating film 62 in a vertical direction is provided above each of the inter-trench regions 42 within the first element range 11 and the second element range 12. A wide contact hole 62b piercing the interlayer insulating film 62 in the vertical direction is provided within the surrounding range 13. The wide contact hole 62b extends on the upper surface 18a of the semiconductor substrate 18 so as to surround the first element range 11 along the surrounding range 13. Although within a range shown in FIG. 2, a width W3 of the wide contact hole 62b in the y direction is slightly narrower than the width W1 of the surrounding range 13 in the y direction, the width W3 and width W1 are substantially equal. The width W3 is wider than twice the above-described pitch P1. Although within a range shown in FIG. 3, a width W4 of the wide contact hole 62b in the x direction is slightly smaller than a width W2 of the surrounding range 13 in the x direction, the width W4 and width W2 are substantially equal. The width W4 is wider than twice the above-described pitch P1. Contact holes are provided in the interlayer insulating film 62 within the outer peripheral voltage resistant range 14 above the terminal region 34 and above the respective guard rings 36 and the like.

The ohmic metal layer 51 covers the interlayer insulating film 62 in the first element range 11, the surrounding range 13, and the second element range 12. The ohmic metal layer 51 is constituted of AlSi (alloy of aluminum and silicon). The ohmic metal layer 51 extends along a surface of the interlayer insulating film 62 and the upper surface 18a of the semiconductor substrate 18, and has a substantially constant thickness.

An upper surface of the ohmic metal layer 51 is recessed following the contact holes 62a within the first element range 11 and the second element range 12. That is, recesses 51a are provided on the surface of the ohmic metal layer 51 above the respective contact holes 62a. The ohmic metal layer 51 is in contact with the upper surface 18a of the semiconductor substrate 18 in each contact hole 62a. The ohmic metal layer 51 is in ohmic contact with the emitter regions 22 and the high density region 24a of the body region 24 in each contact hole 62a.

The upper surface of the ohmic metal layer 51 is recessed following the wide contact hole 62b within the surrounding range 13. That is, a recess 51b is provided on the surface of the ohmic metal layer 51 above the wide contact hole 62b. As shown in FIG. 2, a width of the recess 51b in the y direction is substantially equal to the width W3 of the wide contact hole 62b in the y direction. Further, as shown in FIG. 3, a width of the recess 51b in the x direction is substantially equal to the width W4 of the wide contact hole 62b in the x direction. A bottom surface of the recess 51b (i.e., surface of a portion constituting the bottom of the recess 51b of the ohmic metal layer 51) is flat along the upper surface 18a of the semiconductor substrate 18. As the recess 51b is wide, a wide flat surface is formed within the recess 51b. The ohmic metal layer 51 is in contact with the upper surface 18a of the semiconductor substrate 18 within the wide contact hole 62b. The ohmic metal layer 51 is in contact with the p-type peripheral region 29 within the wide contact hole 62b.

A part of the ohmic metal layer 51 extends up to above the terminal region 34. The ohmic metal layer 51 is in ohmic contact with the terminal region 34 in the contact hole above the terminal region 34.

The respective ring-electrodes 53 are disposed on the respective guard rings 36. The ring-electrodes 53 extend in an annular shape along the guard rings 36. Each ring-electrode 53 is in ohmic contact with the corresponding guard ring 36 within the contact hole above the guard ring 36.

The insulating protective film 60 is disposed on the ohmic metal layer 51, the interlayer insulating film 62, and the ring-electrodes 53 within the second element range 12 and within the outer peripheral voltage resistant range 14. Entire surfaces of the second element range 12 and the outer peripheral voltage resistant range 14 are covered with the insulating protective film 60. A part of the insulating protective film 60 extends over into the surrounding range 13, and covers an outer peripheral side portion of the bottom surface of the recess 51b (i.e., the ohmic metal layer 51 constituting the bottom surface of the recess 51b). The insulating protective film 60 has an opening 80 at a center of the upper surface 18a of the semiconductor substrate 18. As shown in FIG. 1, the opening 80 is provided in a range broader than the first element range 11 that includes the first element range 11. That is, the entirety of the first element range 11 and an inner peripheral portion of the surrounding range 13 are positioned within the opening 80. As shown in FIGS. 1, 2, an inner peripheral side end 60a of the insulating protective film 60 (i.e., a side surface of the opening 80) is positioned within the recess 51b (i.e., within the surrounding range 13). The insulating protective film 60 is constituted of resin (e.g., polyimide). A linear expansion coefficient of the insulating protective film 60 is slightly greater than a linear expansion coefficient of the ohmic metal layer 51 (i.e., AlSi).

The surface metal layer 52 covers the surface of the ohmic metal layer 51 in a range not covered with the insulating protective film 60 (i.e., an inner peripheral portion of the ohmic metal layer 51 within the surrounding range 13, and the ohmic metal layer 51 in the first element range 11). The surface metal layer 52 is filled in each recess 51a within the first element range 11. Further, the surface metal layer 52 is filled in the recess 51b in the range not covered with the insulating protective film 60. The surface metal layer 52 is in contact with the ohmic metal layer 51 in the bottom surface of the recess 51b (i.e., flat surface). As shown in FIG. 2, a width W5 in the y direction of a range where the surface metal layer 52 is in contact with the ohmic metal layer 51 at the bottom surface of the recess 51b is wider than the width of the recess 51a in the y direction, and is wider than the above-described pitch P1. Further, as shown in FIG. 3, a width W6 in the x direction of the range where the surface metal layer 52 is in contact with the ohmic metal layer 51 at the bottom surface of the recess 51b is wider than the width of the recess 51a in the y direction, and is wider than the above-described pitch P1. A part of the surface metal layer 52 on the outer peripheral side extends to above the insulating protective film 60. Thus, the surface metal layer 52 is in contact with the insulating protective film 60 at the inner peripheral side end 60a of the insulating protective film 60 (i.e., side surface of the opening 80). The surface metal layer 52 is constituted of Nickel. The surface metal layer 52 (i.e., Nickel) has a high solder wettability. The linear expansion coefficient of the surface metal layer 52 (i.e., Nickel) is smaller than the linear expansion coefficient of the ohmic metal layer 51 (i.e., AlSi). A soldering layer 55 is bonded to the surface metal layer 52. The surface metal layer 52 is connected by the soldering layer 55 to a metal block not shown.

A lower electrode 54 is disposed on the lower surface 18b of the semiconductor substrate 18. The lower electrode 54 is in ohmic contact with the collector region 28.

Next, operation of the IGBT 10 will be described. The IGBT 10 is used in a state where a voltage that makes the lower electrode 54 have a higher potential is applied between the ohmic metal layer 51 and the lower electrode 54. When a potential higher than a threshold voltage is applied to the gate electrodes 30, channels are formed in the body regions 24 in ranges adjacent to the gate insulating films 32. The channels connect the emitter regions 22 and the drift region 26. Accordingly, electrons flow from the ohmic metal layer 51 to the lower electrode 54 through the emitter regions 22, the channels, the drift region 26, the buffer region 27, and the collector region 28. Further, holes flow from the lower electrode 54 to the ohmic metal layer 51 through the collector region 28, the buffer region 27, the drift region 26, and body regions 24. That is, the IGBT 10 turns on and current flows from the lower electrode 54 to the ohmic metal layer 51.

When the potential of the gate electrodes 30 is decreased to a lower potential than the threshold voltage, the channels disappear. Then, a reverse voltage is applied to pn junctions 25a at interfaces between the body regions 24 and the drift region 26 within the first element range 11 and the second element range 12. Due to this, depletion layers extend from the pn junctions 25a to the body regions 24 and the drift region 26. Since the n-type impurity density of the drift region 26 is extremely low, the drift region 26 is depleted in a wide range. Further, when the depletion layers spread in the body regions 24, holes existing in the depleted range are reunited with electrons in the drift region 26 to disappear. Thus, as the depletion layers spread, the holes existing in the body regions 24 decrease.

Further, within the surrounding range 13, reverse voltage is applied to a pn junction 25b of an interface between the p-type peripheral region 29 and the drift region 26. Due to this, depletion layer extends from the pn junction 25b to the p-type peripheral region 29 and the drift region 26. The drift region 26 is depleted by the depletion layer extending from the pn junction 25b as well. Further, as the depletion layer extends to the p-type peripheral region 29, holes that exist in the depleted region are reunited with electrons in the drift region 26 to disappear. Thus, as the depletion layer extends, the holes that exist in the p-type peripheral region 29 decrease.

Further, within the outer peripheral voltage resistant range 14, reverse voltage is applied to a pn junction 25c at an interface between the terminal region 34 and the drift region 26. Due to this, a depletion layer extends from the pn junction 25c to the terminal region 34 and the drift region 26. When the depletion layer extending from the pn junction 25c to the drift region 26 reaches a first guard ring 36, which is positioned on the innermost peripheral side, the depletion layer extends from the first guard ring 36 to the drift region 26 around that first guard ring 36. When the depletion layer extending from the first guard ring 36 to the drift region 26 reaches a second guard ring 36, which is positioned next to the first guard ring 36, then the depletion layer extends from the second guard ring 36 to the drift region 26 around that second guard ring 36. As such, within the outer peripheral voltage resistant range 14, the depletion layer extends to the outer peripheral side via the plurality of guard rings 36. Due to this, within the outer peripheral voltage resistant range 14, the drift region 26 is depleted over to a vicinity of the outer peripheral end surface 18c of the semiconductor substrate 18.

As explained above, if the potential of the gate electrodes 30 is lowered to a potential lower than the threshold voltage, the channels disappear, thereby depleting the drift region 26 in a wide range. The body regions 24 are separated from the buffer region 27 by the depletion layers. Due to this, when the potential of the gate electrodes 30 is lowered to a potential lower than the threshold voltage, the current flowing in the IGBT 10 is stopped. That is, the IGBT 10 is turned off.

Figure 4:
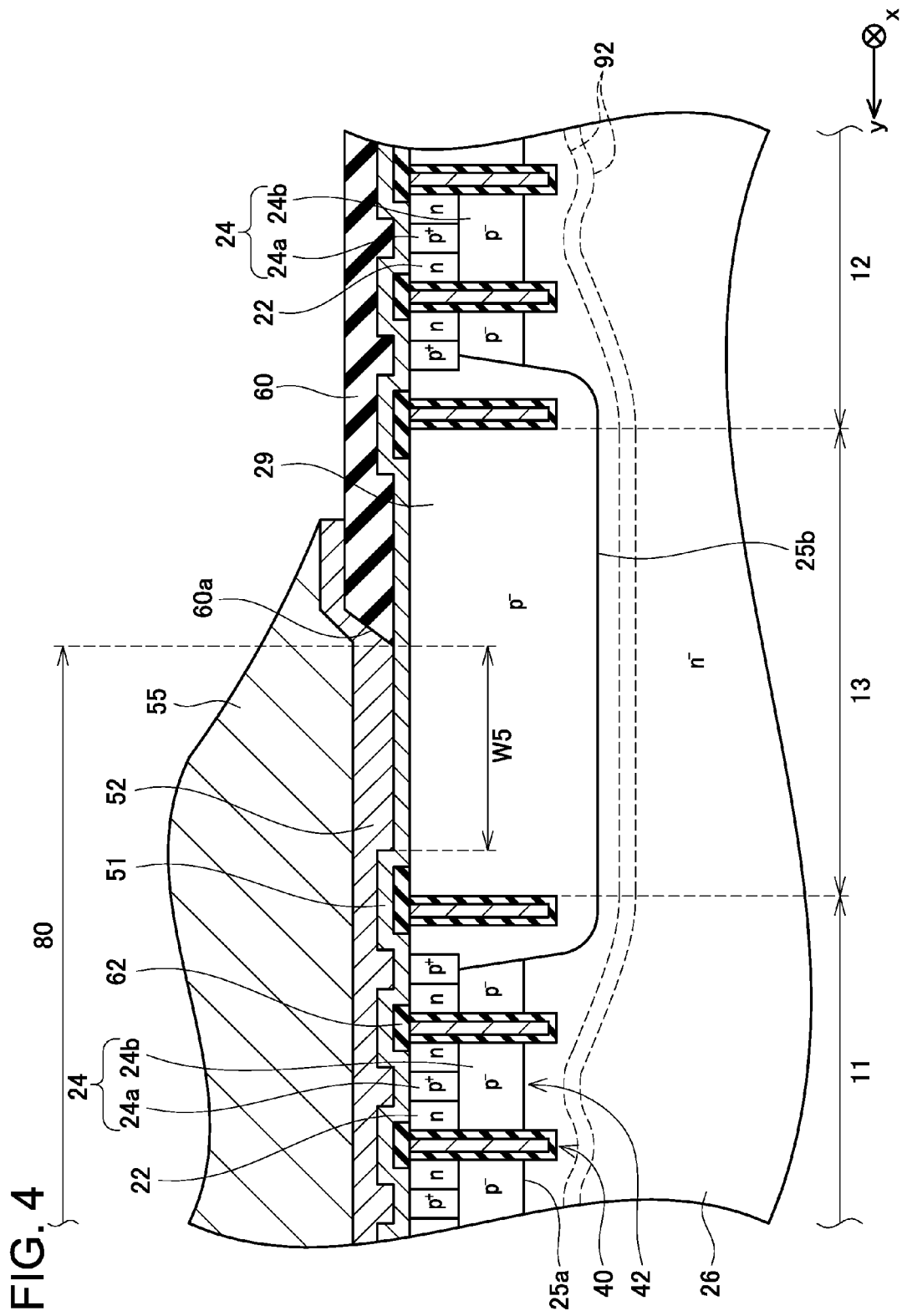
FIG. 4 is an enlarged view of FIG. 2.

Equipotential lines 92 in FIG. 4 show an electric potential distribution within the drift region 26 in a state where the IGBT 10 is off. The drift region 26 is depleted in an entire range shown in FIG. 4. Further, although the p-type peripheral region 29 and the body regions 24 are partially depleted in vicinities of the lower ends thereof most of the p-type peripheral region 29 and the body regions 24 are not depleted.

As shown in FIG. 4, in the first element range 11 and the second element range 12, the trenches 40 protrude to be lower than the lower ends of the body regions 24, the equipotential lines 92 shift downward at portions below the trenches 40 compared to portions below the body regions 24. It should be noted that since the potential of the body regions 24 is substantially equal to the potential of the gate electrodes 30 and a difference in depth between the lower ends of the body regions 24 and the lower ends of the gate electrodes 30 is small, a difference in depth of the equipotential lines 92 between the portions below the body regions 24 and the portions below the gate electrodes 30 is not significantly large.

Within the surrounding range 13, the p-type peripheral region 29 extends to a depth lower than the lower ends of the trenches 40. Due to this, the equipotential lines 92 shift downward at a portion below the p-type peripheral region 29 (i.e., within the surrounding region 13) compared to the equipotential lines 92 within the first element range 11 and the second element range 12. When the equipotential lines 92 are distributed as such, the electric field is alleviated at lower ends of the trenches 40 disposed in the vicinity of the surrounding range 13. In the IGBT 10, the electric field concentration is suppressed in the surrounding range 13 and its peripheries. Thus, the IGBT 10 has a high breakdown voltage.

Further in the cross section shown in FIG. 3, the ends of the trenches 40 in the x direction are covered by p-type peripheral region 29. The p-type impurity density of the p-type peripheral region 29 is adjusted to a level by which a portion covering the ends of the trenches 40 in the x direction is not completely depleted (level at least higher than the p-type impurity density of the lower density regions 24b of the body regions 24). Accordingly, even when the IGBT 10 is off, the ends of the trenches 40 in the x direction are covered by the p-type peripheral region 29 that is not depleted. Due to this, the electric field is less likely to be applied to the ends of the trenches 40 in the x direction. Thus, electric field concentration is suppressed also in the ends of the trenches 40 in the x direction. Thus, the IGBT 10 has a high breakdown voltage.

When the IGBT 10 is again turned from the OFF state to a state where the potential of the gate electrodes 30 is raised to a potential higher than its threshold voltage, channels are formed in the body regions 24 and the potential of the drift region 26 decreases. Then holes are supplied from the ohmic metal layer 51 to the body regions 24 via the contact holes 62a. Due to this, the depletion layers that had extended from the pn junctions 25a at the interfaces between the body regions 24 and the drift region 26 shrink and disappear. Due to this, electrons and holes become able to flow in the drift region 26, and thus the IGBT 10 is turned on.

Further, when the potential of the drift region 26 is decreased, holes are supplied from the ohmic metal layer 51 to the p-type peripheral region 29 via the wide contact hole 62b. Due to this, the depletion layer that had extended from the pn junction 25b at the interface between the p-type peripheral region 29 and the drift region 26 shrinks and disappears. Accordingly, electrons and holes become able to flow also in the drift region 26 below the p-type peripheral region 29. Due to this, a width of a portion in the drift region 26 where the electrons and the holes can flow becomes larger, the resistance of the drift region 26 decreases. Since the p-type peripheral region 29 is directly connected to the ohmic metal layer 51 thereon, the holes are shortly supplied to the p-type peripheral region 29 when the IGBT 10 is tuned on. Due to this, the resistance of the drift region 26 decreases shortly after the IGBT turns on. Accordingly, a loss is not likely to be generated in this IGBT 10.

Further, by the IGBT 10 repeating to turn ON and OFF, the temperature of the semiconductor substrate 18 repeatedly changes. Due to this, the temperatures of the ohmic metal layer 51, the surface metal layer 52, and the insulating protective film 60 above the semiconductor substrate 18 repeatedly change as well.

The ohmic metal layer 51 thermally expands along with the surface metal layer 52 in the range where the ohmic metal layer 51 is in contact with the surface metal layer 52 (i.e., the first element range 11 and an inner peripheral portion of the surrounding range 13). As described above, the linear expansion coefficient of the surface metal layer 52 (i.e., Nickel) is smaller than the linear expansion coefficient of the ohmic metal layer 51 (i.e., AlSi). Due to this, the thermal expansion of the ohmic metal layer 51 is suppressed in this range. Since the surface metal layer 52 is filled in each recess 51a in the upper surface of the ohmic metal layer 51 in the first element range 11, the ohmic metal layer 51 is firmly restrained by the surface metal layer 52. Due to this, thermal expansion amount of the ohmic metal layer 51 in the first element range 11 is small. On the other band, within the surrounding range 13 (i.e., within the wide recess 51b) the upper surface of the ohmic metal layer 51 (i.e., bottom surface of the recess 51b) is flat. As such, since the upper surface of the ohmic metal layer 51 is flat in such a wide range, and the surface metal layer 52 is in contact with such a flat upper surface, restraint force of the surface metal layer 52 on the ohmic metal layer 51 is small in the recess 51b. Accordingly, thermal expansion amount of the ohmic metal layer 51 is larger in this range than the thermal expansion amount of the ohmic metal layer 51 in the first element range 11.

The ohmic metal layer 51 thermally expands along with the insulating protective film 60 in the range where the ohmic metal layer 51 is in contact with the insulating protective film 60 (i.e., on an outer peripheral side of the surrounding range 13, the second element range 12, and the outer peripheral voltage resistant range 14). As described above, the linear expansion coefficient of the insulating protective film 60 (i.e., polyimide) is slightly larger than the linear expansion coefficient of the ohmic metal layer 51 (i.e., AlSi). Due to this, in this range the ohmic metal layer 51 has the largest thermal expansion amount within a range shown in FIG. 2.

As described above, in the IGBT 10 of embodiment 1, the inner peripheral side end 60a of the insulating protective film 60 (i.e., the side surface of the opening 80) is positioned in the surrounding range 13 (i.e., on the flat ohmic metal layer 51). Due to this, a portion of the ohmic metal layer 51 having a relatively large thermal expansion amount (i.e., the inner peripheral side of the surrounding range 13) is adjacent to a portion of the ohmic metal layer 51 having the largest thermal expansion amount (i.e., the outer peripheral side of the surrounding range 13). Due to this, a difference in the thermal expansion amount of the ohmic metal layer 51 is not significantly large around the inner peripheral side end 60a of the insulating protective film 60. Due to this, an extremely large stress is not likely to be generated in the ohmic metal layer 51 below the end 60a. Accordingly, occurrence of cracks in the ohmic metal layer 51 below the end 60a is suppressed. The IGBT 10 of embodiment 1 has a high reliability.

Notably, in the IGBT 10 of embodiment 1, the surface metal layer 52 is formed by sputtering (hereinbelow referred to as a mask sputtering) through a stencil mask (mask plate prepared separately from the semiconductor substrate 18). Since high precision cannot be achieved by the mask sputtering, fluctuation in positions of an outer peripheral side end 52b of the surface metal layer 52 in FIG. 2 is large. If the outer peripheral side end 52b of the surface metal layer 52 extends toward the outer peripheral side than an outer peripheral side end 52c of the ohmic metal layer 51, a potential distribution in the drift region 26 in the outer peripheral voltage resistant range 14 is disturbed, and breakdown voltage of the IGBT 10 decreases. Further, if the outer peripheral side end 52b of the surface metal layer 52 is positioned on an inner peripheral side than the inner peripheral side end 60a of the insulating protective film 60, the ohmic metal layer 51 is exposed, leading to a lower reliability of the IGBT 10. Accordingly, a wide interval may preferably be provided between the outer peripheral side end 52c of the ohmic metal layer 51 and the inner peripheral side end 60a of the insulating protective film 60, and the outer peripheral side end 52b of the surface metal layer 52 may preferably be arranged in the wide interval. In this design, by providing the second element range 12 (i.e., range operating as a switching device) between the outer peripheral side end 52c of the ohmic metal layer 51 and the surrounding range 13, the semiconductor substrate 18 can be effectively utilized, and current capacity of the IGBT 10 can be increased.

Further as in the IGBT 10 of the embodiment 1, a gate capacity (capacity between the gate and the emitter and capacity between the gate and the collector) becomes small by removing the trenches within the surrounding rage 13. Due to this, a switching speed of the IGBT 10 can be improved.

Figure 10:
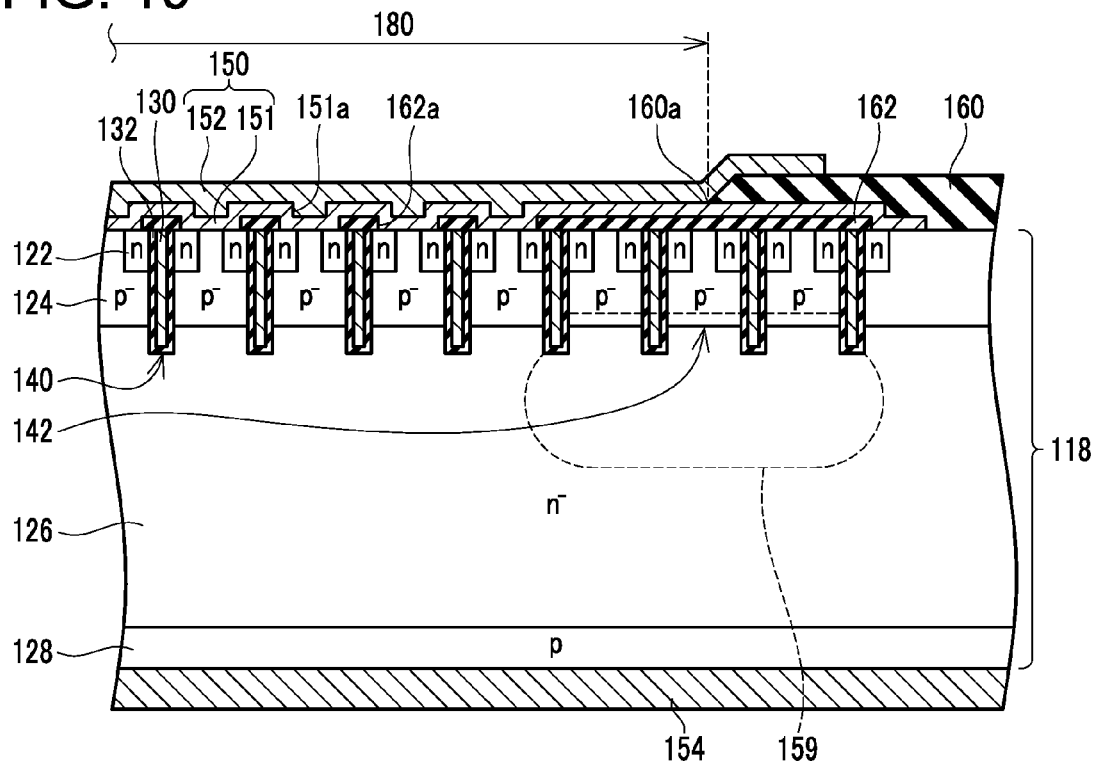
FIG. 10 is a vertical cross sectional view of a switching device of comparative example 2.

Further, in the configuration as in the IGBT 10 of the embodiment 1, in which the ohmic metal layer 51 is in contact with the semiconductor substrate 18 at below the inner peripheral side end 60a of the insulating protective film 60, the stress generated in the ohmic metal layer 51 can be decreased compared to the configuration in which the metal layer 151 is in contact with the interlayer insulating film 162 at below the inner peripheral side end 160a of the insulating protective film 160 as in FIG. 10.

Embodiment 2

Figure 5:
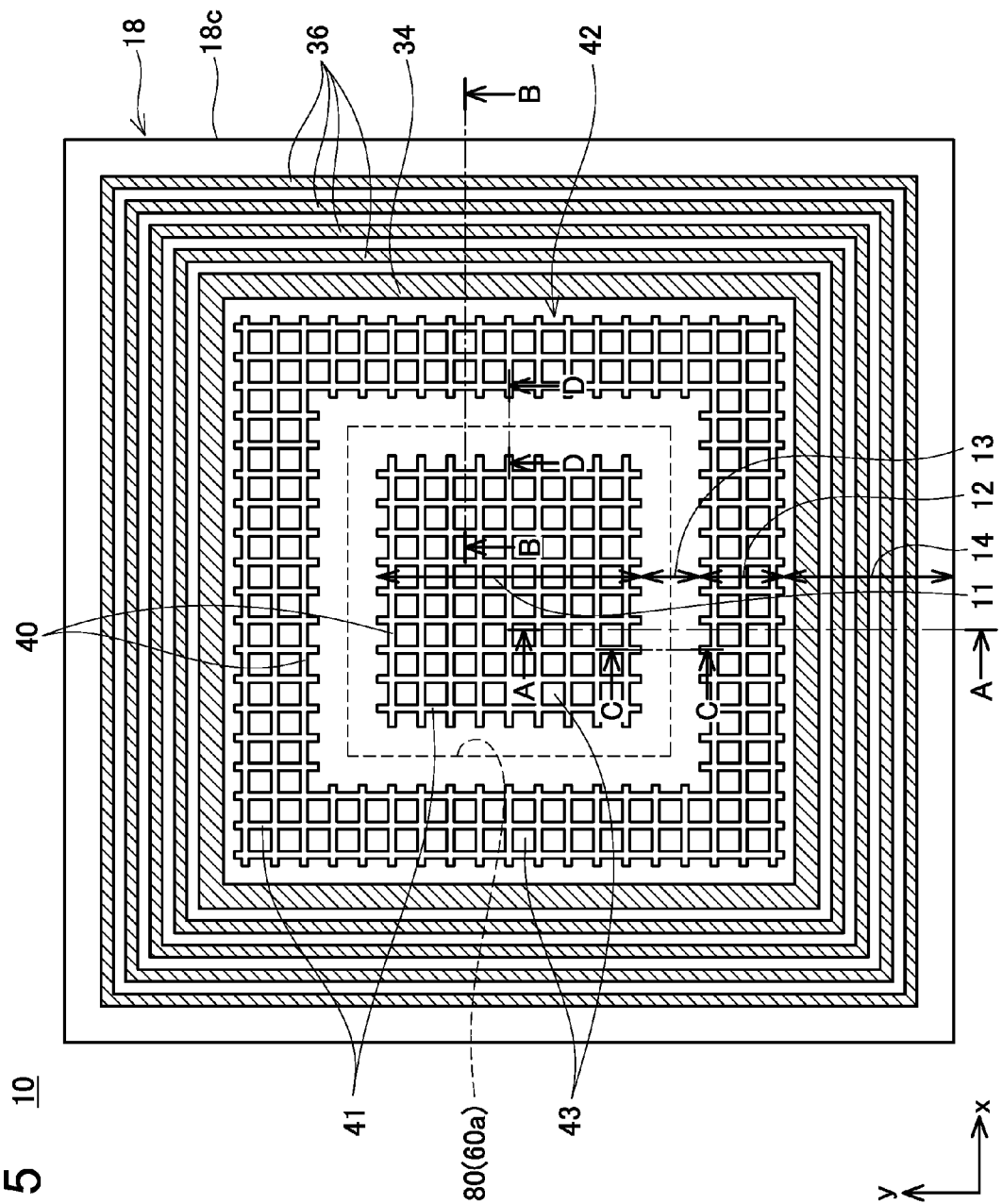
FIG. 5 is a plan view of an IGBT of embodiment 2.

In an IGBT 10 of embodiment 2, as shown in FIG. 5, a plurality of trenches 41 extending in the y direction is provided in the upper surface 18a of the semiconductor substrate 18. The trenches 41 are arranged in the first element range 11 and the second element range 12, and are not arranged in the surrounding range 13.

The plurality of trenches 41 extending parallel to each other along the y direction are formed in the first element range 11. The trenches 40 and the trenches 41 are connected to each other. That is, a trench extending in a grid-shape (hereinafter referred to as a grid-shape trench) is formed by the trenches 40 and the trenches 41. The semiconductor region in the first element range is partitioned into rectangular regions by the grid-shape trench. Each of the rectangular semiconductor regions partitioned by the grid-shape trench will be hereinafter referred to as a cell region 43. A plurality of the trenches 41 extending parallel to each other along the y direction is provided also in the second element range 12. A grid-shaped trench is formed by having trenches 40 and the trenches 41 connected to each other also in the second element range 12. Cell regions 43 partitioned by the grid-shaped trench are provided also in the second element range 12. The IGBT 10 of the embodiment 2 has the same configurations as those in the IGBT 10 of the embodiment 1 except for having the trenches 41.

A cross section taken along line A-A in FIG. 5 (position traversing the trenches 40 in the y direction) is similar to the cross section shown in FIG. 2 (embodiment 1). A cross section taken along line C-C in FIG. 5 (position traversing the trenches 41 in the y direction) is similar to the cross section shown in FIG. 3. That is, an end of each trench 41 in the y direction is covered by the p-type peripheral region 29. Accordingly, the electric field concentration is suppressed also in the positions of the line A-A and the line C-C as in embodiment 1. Further, a cross section taken along line B-B in FIG. 5 (position traversing the trenches 41 in the x direction) is approximately similar to the cross section shown in FIG. 2. In addition, a cross section taken along line D-D in FIG. 5 (position traversing the trenches 40 in the x direction) is similar to the cross section shown in FIG. 3. Accordingly, the electric field concentration is suppressed also in the position of line B-B and the position of line D-D similarly to embodiment 1. Further, also in embodiment 2, since the inner peripheral side end 60a of the insulating protective film 60 is positioned in the wide recess 51b, cracks in the first metal layer 51 is suppressed similarly to embodiment 1. Further, also in embodiment 2, since the p-type peripheral region 29 is connected to the first metal layer 51 via the wide contact hole 62b, resistance of the drift region 26 is shortly decreased when the IGBT turns on.

Figure 6:
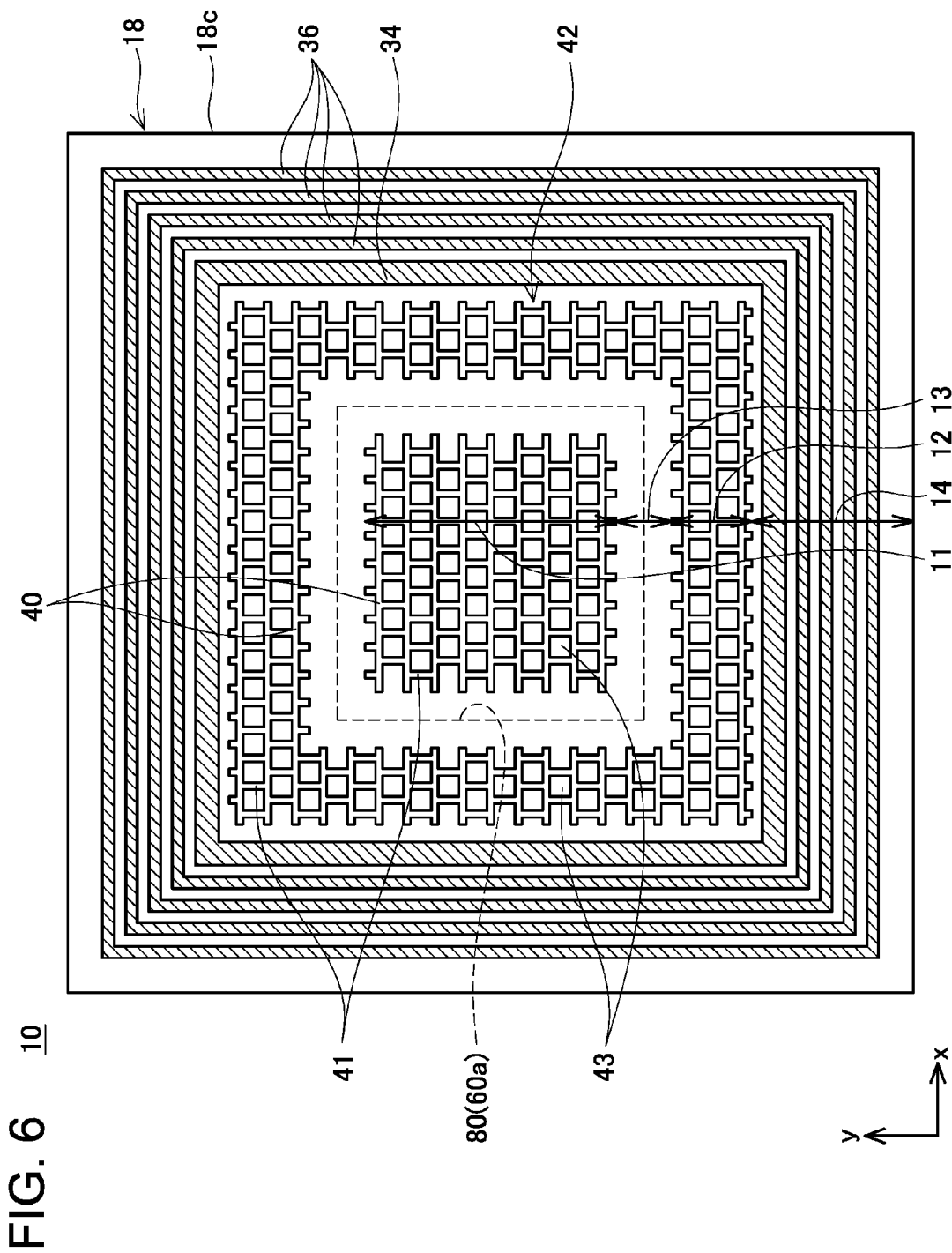
FIG. 6 is a plan view of an IGBT of variant 1.

It should be noted that in the above-described embodiment 2, the trenches 41 extend linearly in the y direction. However, the trenches 41 may extend offset to each other as shown in FIG. 6.

Figure 7:
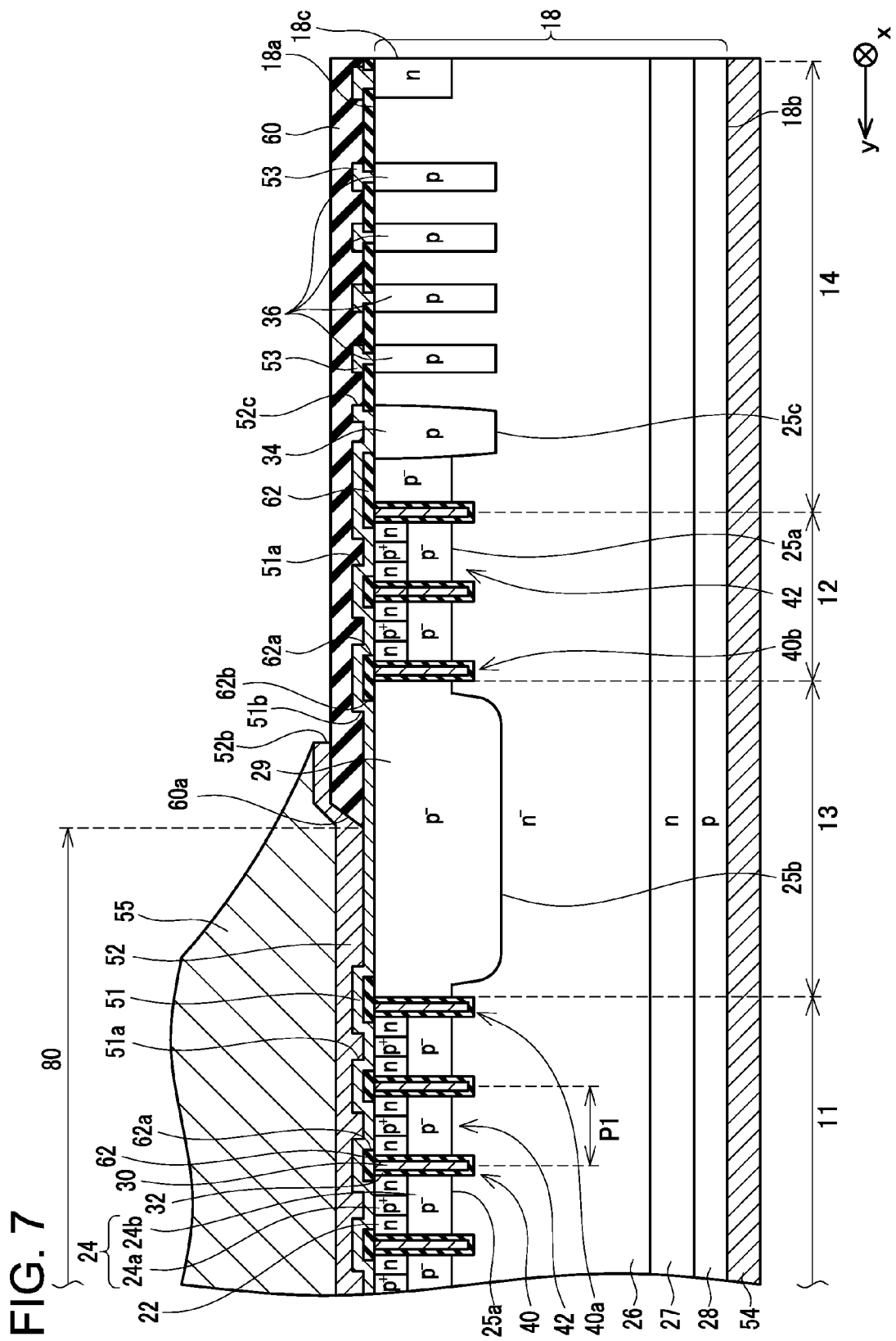
FIG. 7 is a vertical cross sectional view of an IGBT of variant 2.

Further, in the above-described embodiments land 2, the trenches 40a and 40b, which are closest to the surrounding range 13, are covered by the p-type peripheral region 29. However the trenches 40a and 40b closest to the surrounding range 13 may not be covered by the p-type peripheral region 29, as shown in FIG. 7. It should be noted that, in FIG. 7, the p-type peripheral region 29 (i.e., p-type region extending deeper than the lower ends of the body regions 24) may preferably be positioned as close as possible to the trenches 40a and 40b closest to the surrounding range 13 in order to ensure high breakdown voltage. For example, an interval between the p-type peripheral region 29 and the trench 40a (or the trench 40b) may preferably be smaller than the above-described pitch P1.

Figure 8:
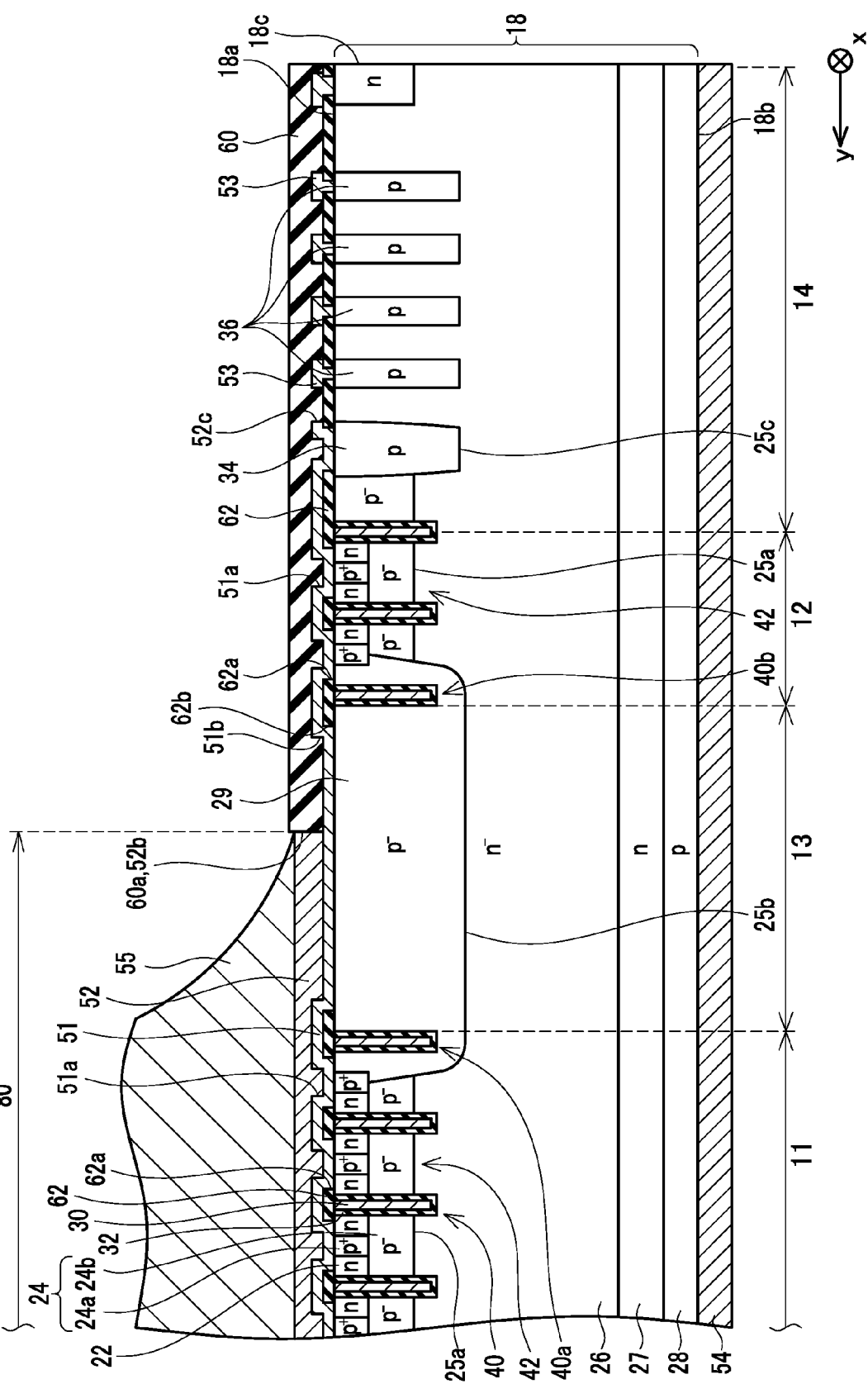
FIG. 8 is a vertical cross sectional view of an IGBT of variant 3.
Figure 9:
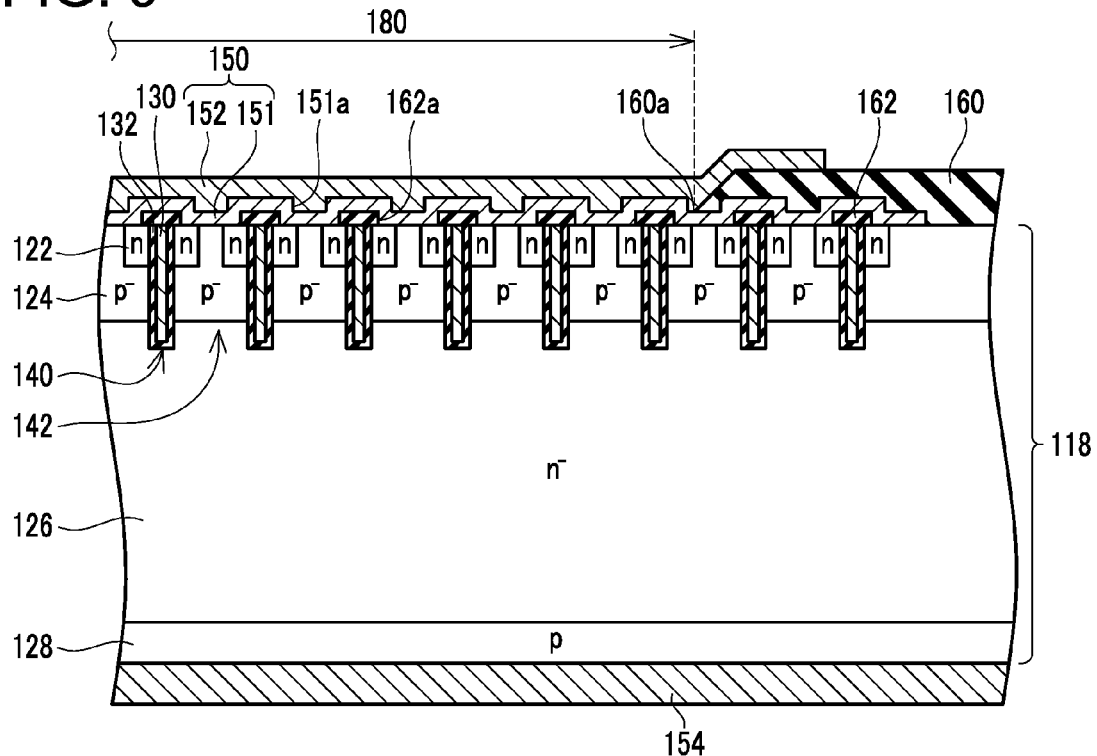
FIG. 9 is a vertical cross sectional view of a switching device of comparative example 1.

It should be noted that in the above-described embodiments 1 and 2, the surface metal layer 52 is formed by mask sputtering. However, the surface metal layer 52 may be formed by plating. In this case, as shown in FIG. 8, the outer side end 52b of the surface metal layer 52 makes contact with the inner side end 60a of the insulating protective film 60 (i.e., side surface of the opening 80) without extending to above the insulating protective film 60. This configuration as well may bring the same advantageous effect as that in the above-described embodiments.

Further, in the above-described embodiments 1 and 2, the IGBT is explained. Alternatively, the technique disclosed herein may be applied to other switching devices including MOSFET. By providing an n-type region (drain region) which is in ohmic contact with the lower electrode 54, instead of the collector region 28 of the embodiments, an n-channel type MOSFET can be obtained. Further, a p-channel type MOSFET can be obtained by reversing the n-type regions and the p-type regions in the n-channel type MOSFET.

Corresponding relationships of the constituent features of the semiconductor devices of the above-described embodiments and the constituent features of the claims will be described. The ohmic metal layer 51 in the embodiments is one example of a first metal layer in the claims. The surface metal layer 52 of the embodiments is one example of a second metal layer in the claims. The emitter region 22 of the embodiments is one example of a first region in the claims. The drift region 26 of the embodiments is one example of a second region in the claims. The p-type peripheral region 29 of the embodiments is one example of a second conductivity-type peripheral region in the claims. The portion of the surrounding range 13 that is adjacent to the first element range 11 in the y direction in the embodiments is one example of an inactive region in the claims. The trenches 40 of the embodiments are one example of first trenches in the claims. The trenches 41 of the embodiments (more specifically, a portion of the trenches 41 extending from the trenches 40 toward the surrounding range 13) is one example of second trenches in the claims.

Some technical elements disclosed herein will be listed. Notably, each of the following technical elements is useful independently.

In a configuration example of the present disclosure, a plurality of second trenches may be provided in the upper surface, and each of the second trenches may extend toward the ineffective range from the first trench positioned closest to the ineffective range. An end surface of each second trench on the ineffective range side may be covered by the second conductivity-type peripheral region.

According to this configuration, a trench having a complicated shape can be constituted by the second trenches and the first trenches. Further, in this configuration, since the end surfaces of the second trenches on an ineffective range side are covered with the second conductivity-type peripheral region, electric field concentration around these end surfaces can be suppressed.

In a configuration example of the present disclosure, a second-conductivity type impurity density of the second conductivity type peripheral region may be higher than a second-conductivity type impurity density of a portion of the body region that is positioned below the first regions.

According to this configuration, since the second conductivity type peripheral region is less likely to be depleted, the electric field concentration can be more efficiently suppressed around the trenches in the vicinities of the ineffective range.

In a configuration example of the present disclosure, the semiconductor substrate may include an outer peripheral voltage resistant range that surrounds a periphery of a range including the first element range and the ineffective range. A guard ring of the second conductivity type may be provided in the outer peripheral voltage resistant range. The guard ring may be exposed in the upper surface, may surround the range including the first element range and the ineffective range, and may be electrically separated from the first metal layer.

According to this configuration, the breakdown voltage of the switching device can be further improved.

In a configuration example of the present disclosure, the semiconductor substrate may further include a second element range arranged between the ineffective range and the outer peripheral voltage resistant range. A plurality of the first trenches may be provided at intervals along the second direction in the upper surface within the second element range. Within the second element range, a contact hole may be provided in a portion of the interlayer insulation film that covers the upper surface. The first metal layer may be in contact with the upper surface in the contact hole in the second element range. The insulating protective film may cover the first metal layer in the second element range. The second metal layer may be disposed and extend across on the first metal layer in the opening and on the insulating protective film. An outer peripheral side end portion of the second metal layer may be positioned on an inner peripheral side relative to an outer peripheral side end portion of the first metal layer. Each of the semiconductor regions interposed between each pair of the adjacent first trenches within the second element range may include the first region and the body region.

For ensuring reliability of the switching device, an interval may be provided between the inner side end portion of the insulating protective film and the outer side end portion of the first metal layer, and an outer side end portion of the second metal layer may be disposed in the interval. By providing the second element range (range functioning as the switching device) in this interval portion, current capacity of the switching device can be increased.

While specific examples of the present invention have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present invention is not limited to the combinations described at the time the claims are filed. Further, the purpose of the examples illustrated by the present description or drawings is to satisfy multiple objectives simultaneously, and satisfying any one of those objectives gives technical utility to the present invention.

What is claimed is:

1. A switching device comprising: a semiconductor substrate; gate insulating films; gate electrodes; an interlayer insulating film; a first metal layer; a second metal layer, and an insulating protective film,
wherein
the semiconductor substrate comprises a first element range and an ineffective range,
a plurality of first trenches is provided in an upper surface of the semiconductor substrate within the first element range and is not provided within the ineffective range, the first trenches extending along a first direction and being arranged at intervals along a second direction perpendicular to the first direction,
the ineffective range is provided adjacent to the first element range in the second direction,
the gate insulating films cover inner surfaces of the first trenches,
the gate electrodes are disposed inside of the first trenches, each gate electrode being insulated from the semiconductor substrate by the corresponding gate insulating film, the interlayer insulating film covers the upper surface and the gate electrodes, within the first element range, a contact hole is provided in a portion of the interlayer insulating film that covers the upper surface, within the ineffective range, a wide contact hole is provided in a portion of the interlayer insulating film that covers the upper surface, the wide contact hole having a width in the second direction that is wider than a pitch between each pair of adjacent first trenches in the second direction, the first metal layer covers the interlayer insulating film, being insulated from the gate electrodes by the interlayer insulating film, the first metal layer being in contact with the semiconductor substrate within the contact hole and the wide contact hole, a first recess is provided in a surface of the first metal layer above the contact hole, and a second recess is provided in the surface of the first metal layer above the wide contact hole, the insulating protective film covers an outer peripheral side part of a bottom surface of the second recess, an opening is provided in the insulating protective film in a range wider than the first element range and including the first element range, a side surface of the opening being disposed in the second recess, the second metal layer is in contact with the surface of the first metal layer in the opening and is in contact with the side surface of the opening, the second metal layer having a linear expansion coefficient smaller than a linear expansion coefficient of the first metal layer, each semiconductor region interposed between each pair of adjacent first trenches in the first element range comprises:
- a first region of a first conductivity type, being in contact with the first metal layer in the contact hole, being in contact with the corresponding gate insulating film; and
- a body region of a second conductivity type, being in contact with the first metal layer in the contact hole, and being in contact with the corresponding gate insulating film below the first region, the semiconductor region within the ineffective range comprises a second conductivity type peripheral region of the second conductivity type, the second conductivity type peripheral region being in contact with the first metal layer in the wide contact hole, and extending from the upper surface to a position deeper than lower ends of the first trenches, the semiconductor substrate further comprises a second region of the first conductivity type, the second region being disposed and extending across below the body region and below the second conductivity type peripheral region, being in contact with the gate insulating films below the body region, and being separated from the first region by the body region.

2. The switching device of claim 1, wherein a plurality of second trenches is provided in the upper surface, each of the second trenches extending toward the ineffective range from the first trench positioned closest to the ineffective range, and each end surface of the second trenches on an ineffective range side is covered with the second conductivity type peripheral region.

3. The switching device of claim 1, wherein a second conductivity-type impurity density of the second conductivity-type peripheral region is higher than a second conductivity-type impurity density of a portion of the body region that is positioned below the first region.

4. The switching device of claim 1, wherein the semiconductor substrate includes an outer peripheral voltage resistant range that surrounds a periphery of a range including the first element range and the ineffective range, and a guard ring of the second conductivity type is provided in the outer peripheral voltage resistant range, the guard ring being exposed on the upper surface, surrounding the range including the first element range and the ineffective range, and being electrically separated from the first metal layer.

5. The switching device of claim 4, wherein the semiconductor substrate further includes a second element range arranged between the ineffective range and the outer peripheral voltage resistant range, a plurality of the first trenches is provided at intervals along the second direction in the upper surface within the second element range, within the second element range, a contact hole is provided in a portion of the interlayer insulation film that covers the upper surface, the first metal layer is in contact with the upper surface in the contact hole within the second element range, the insulating protective film covers the first metal layer within the second element range, the second metal layer is disposed and extending across from on the first metal layer in the opening and to on the insulating protective film, an outer peripheral side end of the second metal layer is positioned on an inner peripheral side relative to an outer peripheral side end of the first metal layer, and each of the semiconductor regions interposed between each pair of adjacent first trenches within the second element range includes the first region and the body region.

* * * * *